(12) United States Patent
Cheng et al.

(10) Patent No.: US 7,190,030 B1
(45) Date of Patent: Mar. 13, 2007

(54) ELECTROSTATIC DISCHARGE PROTECTION STRUCTURE

(75) Inventors: Jyh-Nan Cheng, Toucheng Township, Yilan County (TW); Fang-Mei Chao, Dadu Township, Taichung County (TW); Yii-Chian Lu, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 2 days.

(21) Appl. No.: 11/221,489

(22) Filed: Sep. 7, 2005

(51) Int. Cl.
*H01L 23/62* (2006.01)

(52) U.S. Cl. ...................................................... 257/355
(58) Field of Classification Search ................ 257/342, 257/355–360, 361, 365, 368, 409
See application file for complete search history.

(56) References Cited

U.S. PATENT DOCUMENTS 7,019,368 B1 * 3/2006 McCollum et al. ......... 257/360

* cited by examiner

*Primary Examiner*—B. William Baumeister
*Assistant Examiner*—Dana Farahani
(74) *Attorney, Agent, or Firm*—J.C. Patents

(57) ABSTRACT

The invention provides an ESD protection structure, compatible with the bipolar-CMOS-DMOS (BCD) processes, which provides an enhanced protection performance and better heat dissipation performance. The design of the ESD structures in present invention takes advantage of bipolar punch characteristics of the parasitic bipolar structure to bypass the ESD current, thus significantly reducing the trigger voltage and increasing the ESD protection level. In addition, the ESD protection circuit of the present invention can improve heat dissipation by avoid current crowding near the surface.

18 Claims, 2 Drawing Sheets

ELECTROSTATIC DISCHARGE PROTECTION STRUCTURE

BACKGROUND OF THE INVENTION

1. Field of Invention

The present invention relates to a protection structure. More particularly, the present invention relates to an electrostatic discharge protection structure applied in semiconductor manufacturing processes.

2. Description of Related Art

Semiconductor manufacturers and electronic device users continue to demand faster, increasingly complex devices in smaller packages at lower costs. In order to meet those demands, semiconductor manufacturers keeps shrinking geometries of the devices. As the devices turn compact and clearances and line widths approach theoretical limits, devices are becoming increasingly susceptible to damage by electrostatic discharge (ESD). Short, fast, high-amplitude ESD pulses are an inevitable part of the daily environments of both chips and equipments. In fact, ESD is the leading cause of device failure in the field. The destructive mechanism associated with ESD in devices is primarily melting of the device material due to high temperatures. Due to the nature of ESD, it must be assumed that all devices will encounter an event during the normal course of their lifetime. Hence, ensuring that devices provide a reasonable and acceptable level of tolerance to ESD is an important part of all device design and manufacturing programs.

To determine the ESD threshold of a device, it is necessary to agree on the type of ESD stress for which testing will take place. There are presently three major ESD stress types: Human Body Model (HBM), Machine Model (MM) and Charged Device Model (CDM). For HBM, the threshold voltage can be as high as 2KV, while the threshold voltage for MM is around 200V. Electrostatic discharge, during manufacture, most commonly occurs at the input-output port on the circuit. Typically, an additional protection structure or circuit is designed to provide a discharge path for the additional current caused during electrostatic discharge, thus preventing damage to the device or the IC.

The incorporation of an ESD protection circuit into a deep-submicron MOS circuit is particularly difficult because the gate oxide layer is relatively thin in deep submicron fabrication. In addition, the breakdown voltage of the gate oxide layer is relatively low, about 10–20V. Therefore, triggering voltage of the ESD protection circuit must be lowered to a level below the breakdown voltage of the gate oxide layer in order to provide an effective protection.

SUMMARY OF THE INVENTION

The invention provides an ESD protection structure, compatible with the bipolar-CMOS-DMOS (BCD) processes, which provides an enhanced protection performance and better heat dissipation performance.

The design of the ESD structures in present invention takes advantage of bipolar punch characteristics of the parasitic bipolar structure to bypass the ESD current, thus significantly reducing the trigger voltage and increasing the ESD protection level. In addition, the ESD protection circuit of the present invention can greatly improve heat dissipation by avoid current crowding near the surface.

As embodied and broadly described herein, the invention provides an electrostatic discharge (ESD) protection structure, comprising: a substrate of a first conductive type having a buried layer of a second conductive type therein, an epitaxial layer of the second conductive type above the buried layer and at least a first isolation structure and a second isolation structure disposed at both sides of the epitaxial layer, and at least a first gate and a second gate disposed on the substrate. The epitaxial layer of the second conductive type further comprises a first body region of the first conductive type and a second body region of the first conductive type respectively at one side of the first and second isolation structures, and a drain region of the second conductive type between the first and second P-type body regions, wherein the drain region and the first and second P-type body regions are separated from one another. The first body region includes a first doped region of the first conductive type closer to the first isolation structure and a second doped region of the second conductive type farther from the first isolation structure, while the second body region includes a third doped region of the first conductive type closer to the second isolation structure and a fourth doped region of the second conductive type farther from the second isolation structure. The first gate is disposed between the drain region and the first body region, while the second gate is disposed between the drain region and the second body region.

According to one embodiment, a sinker layer of the second conductive type is further included within the epitaxial layer, extending between the drain region and the buried layer. According to another embodiment, a based region of the second conductive type is further included within the epitaxial layer, and surrounds the drain region. The buried layer of the second conductive type can either be N− buried layer or N+ buried layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The BCD process is a fabrication process for integrating three different semiconductor processes (which have previously been fabricated individually) on a single substrate (one chip). These three processes are: Bipolar process, CMOS (Complementary Metal Oxide Semiconductor) process and DMOS (Double-Diffused MOS) process. In the IC field in recent years, there has been a need for multi-functionality and compact size, and efforts have been made to provide not only control circuits, but also peripheral functions such as sensor processing circuits and microprocessors. To realize both multi-functionality and compact size at the same time, it has become necessary to make each circuit fit on a single chip.

The ESD protection structure of this invention can be fabricated by employing standard process steps of the BCD process without performing additional process steps or using extra photo-masks.

Figure 1:
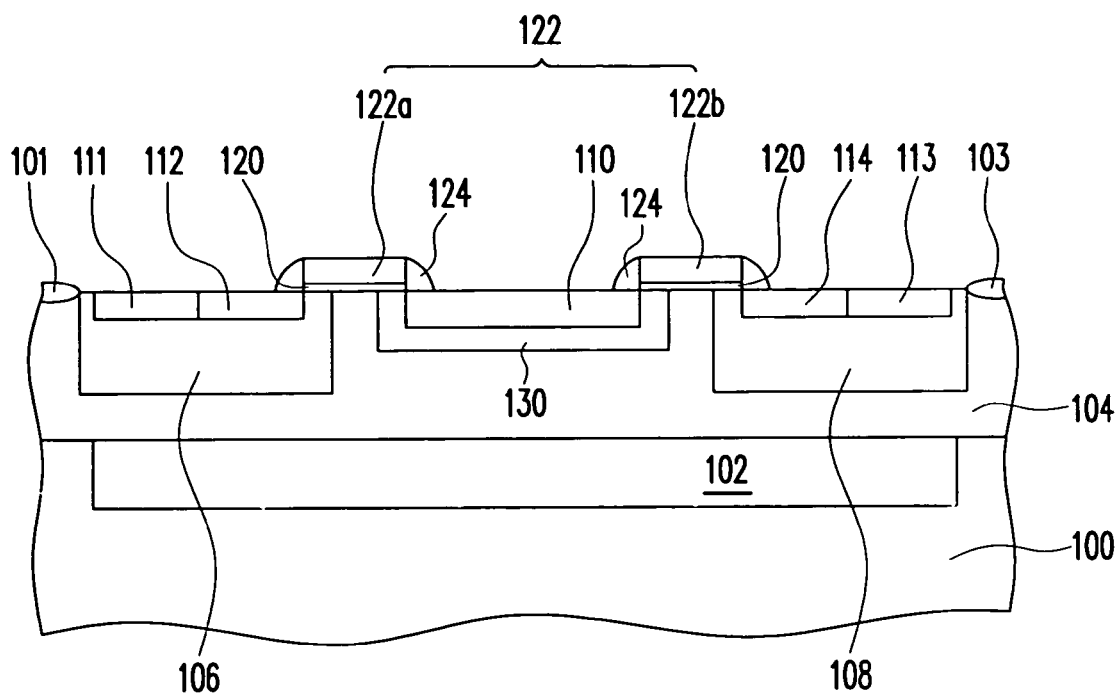
FIG. 1 is a schematic cross-sectional view of the ESD protection structure according to a first preferred embodiment of the present invention, applicable in the BCD process.

FIG. 1 is a schematic cross-sectional view of the ESD protection structure according to a first preferred embodiment of the present invention, applicable in the BCD process. The ESD protection structures of this invention are mainly constructed based on the structure of lateral-diffused MOS (LDMOS). As shown in FIG. 1, the structure comprises a P-type substrate (P substrate) 100, an N– buried layer 102 therein and an N-type epitaxial layer 104 above the N– buried layer 102. At least a first isolation structure 101 and a second isolation structure 103 are disposed at both sides of the N-type epitaxial layer 104 to isolate components within the high-voltage area. The isolation structures can be either FOX or STI structure, for example. The N-type epitaxial layer 104 comprises a first P-type body (P body) region 106 and a second P-type body region 108 respectively at one side of the first and second isolation structures 101, 103, and an N+ drain region 110 between the first and second P-type body regions 106, 108. The N+ drain region 110 and the first and second P-type body regions 106, 108 are separated from one another. The first P-type body region 106 includes a first P+ doped region 111 closer to the first isolation structure 101 and a first N+ doped region 112 farther from the first isolation structure 101, and the first P-type body region 106 surrounds the first P+ doped region 111 and the first N+ doped region 112. The second P-type body region 108 includes a second P+ doped region 113 closer to the second isolation structure 103 and a second N+ doped region 114 farther from the second isolation structure 103, and the second P-type body region 108 surrounds the second P+ doped region 113 and the second N+ doped region 114. The first and second N+ doped regions 112, 114 function as the source regions in the LDMOS structure.

Furthermore, a gate insulating layer 120 is disposed on the N-type epitaxial layer 104, and a gate layer 122 is disposed on the gate insulating layer 120. Preferably, the gate layer 122 is a polysilicon layer. The gate layer 122 is patterned into a first gate 122a and a second gate 122b, and spacers 124 may be further formed on sidewalls of the gates. The N+ drain region 110 is disposed between the first and second gates 122a, 122b.

According to the first preferred embodiment of this invention, an N-type base region 130 is disposed between the N+ drain region 110 and the N-type epitaxial layer 104, and arranged underlying and surrounds the N+ drain region 110. The N-type base region 130 is disposed between the first and second gates 122a, 122b.

By adding the N-type base region 130 between the N+ drain region 110 and the N-type epitaxial layer 104, the concentration gradient between the N+ drain region 110 and the N-type epitaxial layer 104 can be reduced. Therefore, the maximum electric field is located between the N+ drain region 110 and the N-type epitaxial layer 104 and under the gate insulating layer 120, and the breakdown voltage and the trigger voltage can be reduced.

Figure 2:
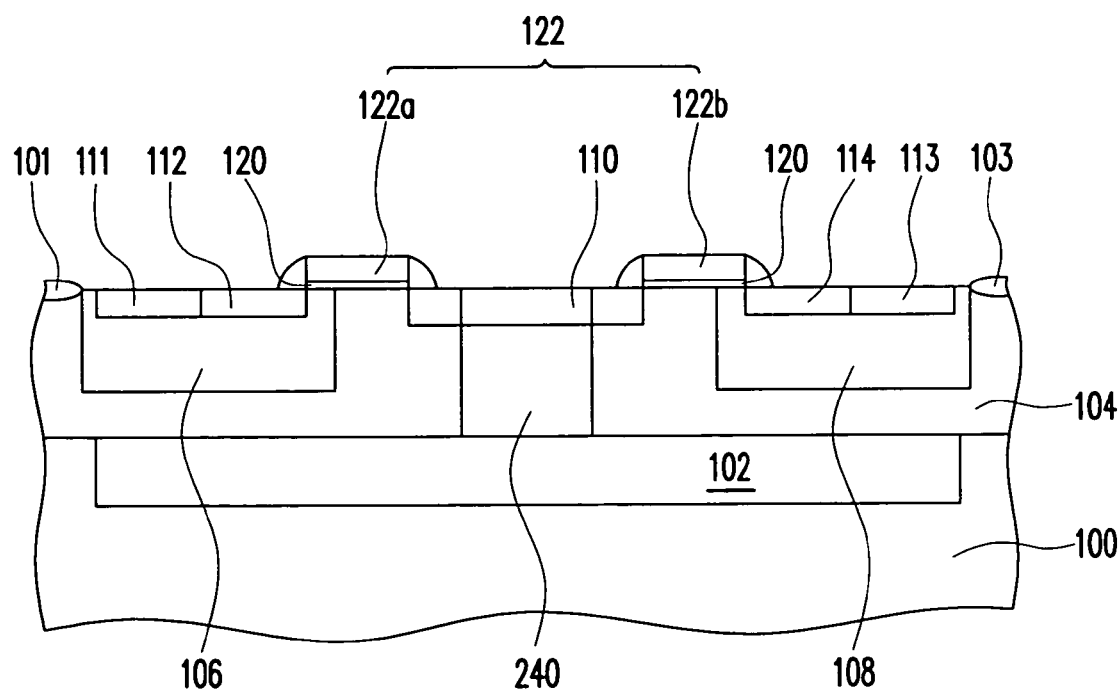
FIG. 2 is a schematic cross-sectional view of the ESD protection structure according to a second preferred embodiment of the present invention, applicable in the BCD process.

FIG. 2 is a schematic cross-sectional view of the ESD protection structure according to a second preferred embodiment of the present invention, applicable in the BCD process. Compared with the structure of FIG. 1, the same elements are denoted with the same reference numbers and will not be described in details herein. As shown in FIG. 2, instead of the N-type base region, an N-type sinker layer 240 is disposed within the N-type epitaxial layer 104 and between the N+ drain region 110 and the N– buried layer 102. Moreover, the N-type sinker layer 240 is disposed between the first and second gates 122a, 122b. The N-type sinker layer 240 is electrically connected to both the N– buried layer 102 and the drain region 110. The width of N-type sinker layer 240 is narrower than the width of the N+ drain region 110. The width w and the distance from the N-type sinker layer 240 to the gate 122a/122b can be adjusted according to the electrical requirements of the device.

The formation of the N-type sinker layer 240 provides a low resistant path for ESD current and the current thus flows from the source, through the N-type sinker layer 240 to the drain region 110. By adding the N-type sinker layer 240 between the N+ drain region 110 and the N– buried layer 102, current crowding near the surface region can be alleviated and a better parasitic BJT path to bypass the ESD current is provided. The N+ doped region 112/114, the P body region 106/108 and the N-type epitaxial layer 104 can be considered as vertical NPN structures to bypass the ESD current, thus significantly increasing the ESD protection level. Accordingly, in such electrostatic discharge protection circuit with a sinker layer electrically connected to the drain and the buried layer, the current flows in the substrate from the source through the buried layer and the sinker layer to the drain. Therefore, a large current flowing through a surface of the gate dielectric layer is prevented and the thermal energy generated thereby is effectively dissipated. Moreover, the area of the N+ drain region 110 can be increased by forming the N-type sinker layer 240.

Figure 3:
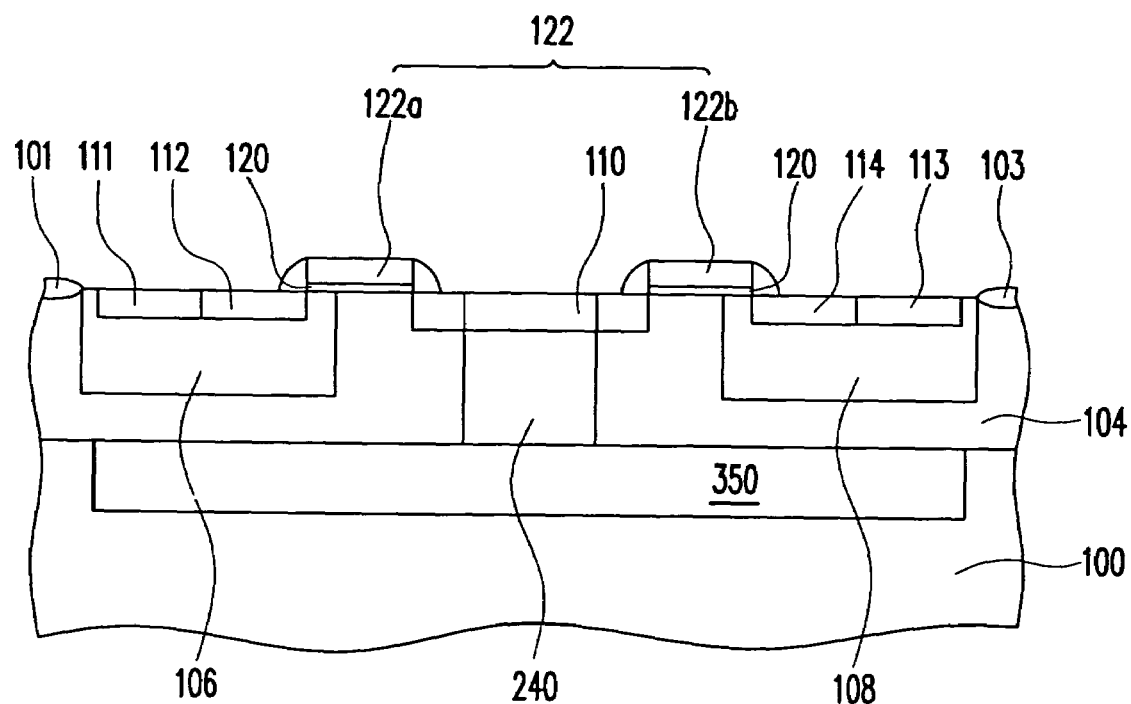
FIG. 3 is a schematic cross-sectional view of the ESD protection structure according to a third preferred embodiment of the present invention, applicable in the BCD process.

FIG. 3 is a schematic cross-sectional view of the ESD protection structure according to a third preferred embodiment of the present invention, applicable in the BCD process. Compared with the structures of FIGS. 1 and 2, the same elements are denoted with the same reference numbers and will not be described in details herein. As shown in FIG. 3, in addition to the N-type sinker layer 240, an N+ buried layer 350 replaces the N– buried layer 102. The N+ buried layer 350 is disposed at a junction between the N-type epitaxial layer 104 and the substrate 100. The N+ buried layer 350 is doped with a higher dosage when compared with the N– buried layer 102. The width of the N+ buried layer 350 extends from the first P body 106 to the second P body 108.

The formation of the N+ buried layer 350 and the N-type sinker layer 240 provides an even lower resistant path for ESD current and the current thus flows from the source, through the N-type sinker layer 240 and the N+ buried layer 350 to the drain region 110. By increasing the implant dosage of the buried layer (from N– buried layer to N+ buried layer), the breakdown voltage and the trigger voltage can be reduced.

Figure 4:
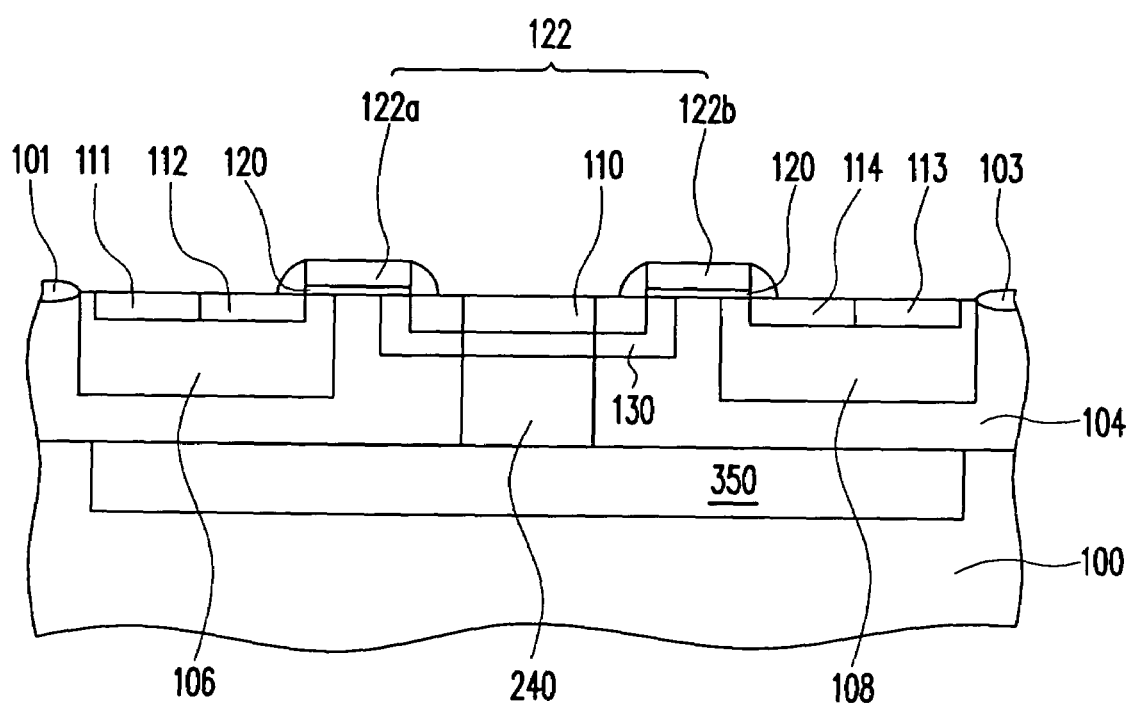
FIG. 4 is a schematic cross-sectional view of the ESD protection structure according to a fourth preferred embodiment of the present invention, applicable in the BCD process.

FIG. 4 is a schematic cross-sectional view of the ESD protection structure according to a fourth preferred embodiment of the present invention, applicable in the BCD process. Combining the structures of FIGS. 1 and 3, as shown in FIG. 4, the ESD structure can be designed to includes the N-type base region 130, the N-type sinker layer 240 and the N+ buried layer 350, as described respectively above.

The above structures of the electrostatic discharge protection circuit can be easily fabricated and integrated with the BCD process. That is, the electrostatic discharge protection structure either with the base region, or/and with the sinker layer and/or with the N+ buried layer can be formed together using the BCD process. However, the application of the invention is not limited to BCD process only. In fact, the process for fabricating the electrostatic discharge protection circuit can be performed individually or integrated with other processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) protection structure, comprising:
   an P-type substrate having a buried layer therein, the P-type substrate further comprising:
   an N-type epitaxial layer above the buried layer;
   at least a first isolation structure and a second isolation structure disposed at both sides of the N-type epitaxial layer;
   a first P-type body (P body) region and a second P-type body region respectively at one side of the first and second isolation structures;
   an N-type base region located between the first and the second P-type body regions, wherein the N-type base region, the first P-type body region and the second P-type body region are separated from each other;
   an N-type drain region disposed in and surrounded by the N-type base region; and
   a first P+ doped region and a first N+ doped region disposed in the first P-type body region, wherein the first P+ doped region is closer to the first isolation structure than the first N+ doped region;
   a second P+ doped region and a second N+ doped region disposed in the second P-type body region, wherein the second P+ doped region is closer to the second isolation structure than the second N+ doped region; and
   at least a first gate and a second gate disposed on the P-type substrate, wherein the first gate is disposed between the N-type drain region and the first P-type body region, while the second gate is disposed between the N-type drain region and the second P-type body region.

2. The ESD protection structure of claim 1, wherein an N-type sinker layer is further included within the N-type epitaxial layer, extending between the N-type drain region and the buried layer.

3. The ESD protection structure of claim 2, wherein the buried layer is an N− buried layer, extending from the first P-type body region to the second P-type body region.

4. The ESD protection structure of claim 2, wherein the buried layer is an N+ buried layer, extending from the first P-type body region to the second P-type body region.

5. The ESD protection structure of claim 2, wherein a width of the N-type sinker layer is smaller than that of the N-type drain region.

6. An electrostatic discharge (ESD) protection structure, comprising:
   an P-type substrate having a buried layer therein, the P-type substrate further comprising:
   an N-type epitaxial layer above the buried layer;
   at least a first isolation structure and a second isolation structure disposed at both sides of the N-type epitaxial layer;
   a first P-type body region and a second P-type body region respectively at one side of the first and the second isolation structures;
   an N-type sinker layer and an N-type drain region between the first and the second P-type body regions, wherein the N-type drain region, the first P-type body region and the second P-type body region are separated from each other, and the sinker layer extending between the N-type drain region and the buried layer;
   a first P+ doped region and a first N+ doped region disposed in the first P-type body region, wherein the first P+ doped region is closer to the first isolation structure than the first N+ doped region,
   a second P+ doped region and a second N+ doped region disposed in the second P-type body region, wherein the second P+ doped region is closer to the second isolation structure than the second N+ doped region; and,
   at least a first gate and a second gate disposed on the P-type substrate, wherein the first gate is disposed between the N-type drain region and the first P-type body region, while the second gate is disposed between the N-type drain region and the second P-type body region.

7. The ESD protection structure of claim 6, wherein the buried layer is an N− buried layer, extending from the first P-type body region to the second P-type body region.

8. The ESD protection structure of claim 6, wherein the buried layer is an N+ buried layer, extending from the first P-type body region to the second P-type body region.

9. The ESD protection structure of claim 6, wherein a width of the N-type sinker layer is smaller than that of the N-type drain region.

10. An electrostatic discharge (ESD) protection circuit, comprising:
    a substrate of a first conductive type having a buried layer of a second conductive type therein, the substrate further comprising:
    an epitaxial layer of the second conductive type above the buried layer;
    at least a first isolation structure and a second isolation structure disposed at both sides of the epitaxial layer;
    a first body region of the first conductive type and a second body region of the first conductive type respectively at one side of the first and the second isolation structures;
    a sinker layer of the second conductive type and a drain region of the second conductive type between the first and the second body regions of the first conductive type, wherein the drain region, the first and the second body regions of the first conductive type are separated from each other;
    a first doped region of the first conductive type and a second doped region of the second conductive type disposed in the first body region, wherein the first doped region is closer to the first isolation structure than the second doped region; and
    a third doped region of the first conductive type and a fourth doped region of the second conductive type disposed in the second body region, wherein the third doped region is closer to the second isolation structure than the fourth doped region; and at least a first gate and a second gate disposed on the substrate, wherein the first gate is disposed between the drain region and the first body region, while the second gate is disposed between the drain region and the second body region.

11. The ESD protection structure of claim 10, wherein the first conductive type is P-type and the second conductive type is N-type.

12. The ESD protection structure of claim 11, wherein the buried layer is an N− buried layer, extending from the first body region to the second body region.

13. The ESD protection structure of claim 11, wherein the buried layer is an N+ buried layer, extending from the first body region to the second body region.

14. The ESD protection structure of claim 10, wherein a width of the sinker layer is smaller than that of the drain region.

15. The ESD protection structure of claim 10, wherein a base region of the second conductive type is further included within the epitaxial layer and surrounds the drain region, and the base region is separate from the first and second body regions.

16. The ESD protection structure of claim 15, wherein the first conductive type is P-type and the second conductive type is N-type.

17. The ESD protection structure of claim 16, wherein the buried layer is an N− buried layer, extending from the first body region to the second body region.

18. The ESD protection structure of claim 16, wherein the buried layer is an N+ buried layer, extending from the first body region to the second body region.

* * * * *